United States Patent
Katsuyama et al.

(10) Patent No.: US 6,793,751 B2
(45) Date of Patent: Sep. 21, 2004

(54) METHOD FOR MANUFACTURING LAMINATED CERAMIC ELECTRONIC COMPONENT

(75) Inventors: Takanobu Katsuyama, Takefu (JP); Eiji Ito, Shiga-ken (JP); Nagato Omori, Takefu (JP); Yasunobu Yoneda, Takefu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/336,020

(22) Filed: Jan. 3, 2003

(65) Prior Publication Data

US 2003/0155064 A1 Aug. 21, 2003

(30) Foreign Application Priority Data

Jan. 7, 2002 (JP) ........................................ 2002-000674

(51) Int. Cl.[7] .............................. B32B 31/26; C01J 7/04; H01G 4/30
(52) U.S. Cl. ............................... 156/89.12; 156/89.16; 156/289
(58) Field of Search ............................. 156/289, 89.12, 156/89.14, 89.16, 89.17, 89.18, 246; 427/79, 80, 126.2; 361/321.2, 321.3

(56) References Cited

U.S. PATENT DOCUMENTS

| | | | |
|---|---|---|---|
| 6,057,041 A | * | 5/2000 | Sumi et al. .................. 428/447 |
| 6,295,196 B1 | * | 9/2001 | Hamaji et al. ............ 361/321.2 |
| 6,320,738 B1 | * | 11/2001 | Yamana et al. ........... 361/321.2 |
| 2003/0148068 A1 | * | 8/2003 | Okumura .................... 428/141 |

FOREIGN PATENT DOCUMENTS

| | | | |
|---|---|---|---|
| JP | 05-092406 | | 4/1993 |
| JP | 5-253913 | * | 10/1993 |
| JP | 7-227903 | * | 8/1995 |
| JP | 9-129505 | * | 5/1997 |
| JP | 10-6443 | * | 1/1998 |
| JP | 10-229027 | * | 8/1998 |
| JP | 2000-30972 | * | 1/2000 |
| JP | 2001-1321 | * | 1/2001 |
| JP | 2001-44065 | * | 2/2001 |

* cited by examiner

Primary Examiner—Melvin C. Mayes
(74) Attorney, Agent, or Firm—Keating & Bennett, LLP (57) ABSTRACT

A method for manufacturing a laminated ceramic electronic component allows for production of highly reliable laminated ceramic electronic components even when the coating rate of a ceramic slurry on a surface of a carrier film is increased in order to reduce the thickness of the ceramic green sheet. A ceramic green sheet is formed by pulling out a carrier film from a carrier film roll, coating the film with a ceramic slurry using a coating apparatus, drying the film with a drying apparatus, and rolling up the film using a take-up apparatus. The carrier film is unrolled, an internal electrode pattern is printed thereon by a printing apparatus, the surface of the film is dried, and the film is rolled up by the take-up apparatus. The rolled carrier film is pulled out, the ceramic green sheet is peeled away, and a plurality of the ceramic green sheets are laminated. Following the cutting of the laminated body into individual elements, these elements are fired, and external electrodes are formed thereon. In this manufacturing process, a film used as the carrier film is such that $R_{max}$ of the ceramic slurry coated surface is about 0.2 $\mu$m or less, and $R_{max}$ of the opposite surface thereof is about 0.5 $\mu$m to 1.0 $\mu$m.

12 Claims, 5 Drawing Sheets

METHOD FOR MANUFACTURING LAMINATED CERAMIC ELECTRONIC COMPONENT

BACKGROUND OF THE INVENTION

1. Field of the Invention

The present invention relates to a method for manufacturing a laminated ceramic electronic component, and more particularly, the present invention relates to a method for manufacturing a laminated ceramic electronic component such as a laminated ceramic capacitor, laminated inductor, and laminated LC filter.

2. Description of the Related Art

Figure 1:
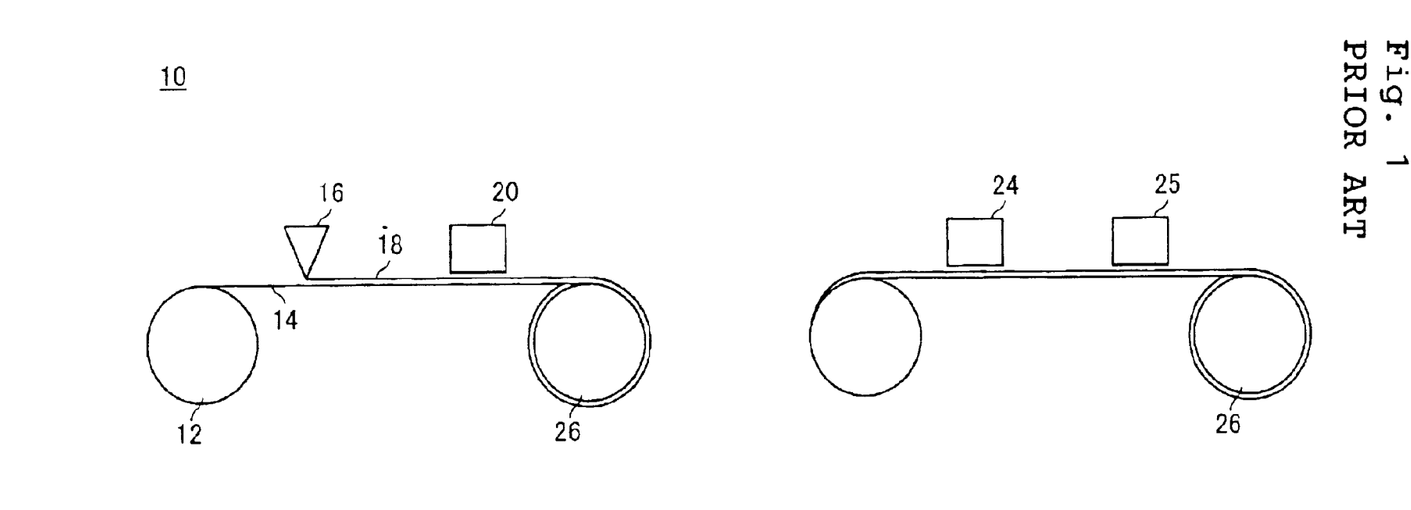
FIG. 1 is a schematic diagram showing the manufacturing apparatus used in a process of a method for manufacturing a laminated ceramic capacitor which serves as a background of the present invention.

FIG. 1 is a schematic diagram showing the manufacturing process of laminated ceramic electronic components such as laminated ceramic capacitors, for example, as described in Japanese Patent Application Kokai No. H5-92406. In a manufacturing apparatus 10 described therein, a carrier film roll 12 around which a carrier film formed from a synthetic resin or the like is rolled up is first prepared. The carrier film 14 is pulled out from this carrier film roll 12, and the surface of the carrier film 14 is coated with a ceramic slurry 18 by a coating apparatus 16.

The carrier film 14 that is coated with the ceramic slurry 18 is sent to a drying apparatus 20 so that the ceramic slurry 18 is dried, after which the carrier film 14 is temporarily rolled up by a take-up apparatus 26. Thus, a ceramic green sheet 22 is formed on the carrier film 14. Next, the rolled-up carrier film is unrolled, and an internal electrode pattern constituting an internal electrode of the laminated ceramic capacitor is printed on the surface of the ceramic green sheet 22 by a printing apparatus 24 The carrier film 14 on which the internal electrode pattern is formed is dried by a drying apparatus 25, and is then taken up in roll form again by the take-up apparatus 26. Furthermore, instead of rolling up the carrier film 14 after the ceramic green sheet has been formed thereon, it is also be possible to continue to print an internal electrode pattern, dry the carrier film, and then roll up the film.

The rolled-up carrier film 14 is subsequently pulled out again, the ceramic green sheet 22 is cut to an appropriate size, and a plurality of the green sheets are laminated. The laminated body formed by laminating the ceramic green sheets 22 is cut into individual elements and fired, so that ceramic sintered bodies having internal electrodes are formed. Laminated ceramic capacitors are manufactured by forming external electrodes on the outer surfaces of the ceramic sintered bodies so that the external electrodes are connected to the internal electrodes.

With the recent trend toward more compact electronic devices, size reduction of laminated ceramic electronic components is required. Laminated ceramic capacitors, for example, are also becoming progressively smaller in size and larger in capacity. Accordingly, the number of layers in a ceramic sintered body is increased, and the thickness of the ceramic layers forming the ceramic sintered body is reduced. In general, however, unevenness inevitably exists on the surfaces of synthetic resin films used as carrier films to form ceramic green sheets. Because of such unevenness, recesses or pinholes may be locally produced in the thinned layers of ceramic green sheets. As a result, problems such as short-circuiting between internal electrodes and a decrease in reliability are encountered in the final product, such as a laminated ceramic capacitor. Thus, the carrier film becomes more susceptible to the effect of surface unevenness by the thinning of ceramic layers.

Therefore, it is necessary to reduce the effect of unevenness by suppressing unevenness on the carrier film surface as much as possible. Incidentally, when a film that is formed into a roll was used as the carrier film to be coated with a ceramic slurry, recesses and pinholes were locally present on the ceramic green sheet even though the surface thereof was made smooth.

As a result of diligent investigations in view of this fact, the present inventors discovered that these problems were caused by the effects of static electricity as described below. In the case of a carrier film roll, the contact area between the overlaid carrier films is increased, so that the carrier film tends to become charged with static electricity when the carrier film is pulled out, thus increasing the electrostatic charge caused by unrolling in this case. Furthermore, because the contact area between the carrier film and the ceramic green sheet is large, the carrier film is apt to be charged with static electricity when the ceramic green sheet is peeled off from the carrier film, which increases the electrostatic charge caused by peeling in this case. The amount of foreign matter mixed inside the ceramic green sheet or laminated body is increased due to the static electricity caused by such charging.

Moreover, a mold release layer or the like that is formed on the ceramic green sheet and carrier film deteriorates due to the discharge of the static electricity caused by charging, so that creases are produced in the ceramic green sheet during peeling. In particular, when the coating rate of the ceramic slurry is increased, because the pulling rate of the carrier film is also increased, the electrostatic charge caused by unrolling is increased, so that the effect of static electricity as described above is increased. As a result, problems such as short-circuiting between internal electrodes and a decrease in reliability occur in the final product such as a laminated ceramic capacitor.

Furthermore, a ceramic slurry is generally applied to the portions of the carrier film excluding both end portions thereof with respect to the direction of width. However, if the unevenness on the surface of the carrier film is reduced, the adhesion characteristics at both end portions are improved when these end portions of the carrier film in the width direction are superimposed during the take-up. Consequently, when the carrier film on which the ceramic green sheet is formed is taken up, air is introduced. If the introduced air escapes during the take-up operation of the carrier film, the roll is misaligned, which creates a problem in that the subsequent handling precision decreases significantly.

Furthermore, when thin ceramic green sheets are formed in order to achieve thinning of ceramic layers, variations in the thickness of the ceramic green sheet can be reduced by increasing the coating rate of the carrier film with the ceramic slurry. Moreover, increasing this coating rate of the ceramic slurry is an essential technique in terms of improving the productivity of laminated ceramic electronic components as well.

SUMMARY OF THE INVENTION

In order to overcome the problems described above, preferred embodiments of the present invention provide a method for manufacturing a laminated ceramic electronic component which makes it possible to obtain highly reliable laminated ceramic electronic components even when the coating rate of the surface of the carrier film with the ceramic slurry is increased in order to reduce the thickness of the ceramic green sheet.

According to a preferred embodiment of the present invention, a method for manufacturing a laminated ceramic electronic component includes the steps of pulling out a carrier film from a carrier film roll, coating one surface of the carrier film with a ceramic slurry at a coating rate of about 30 m/min or higher, forming a ceramic green sheet by drying the coated ceramic slurry, forming an internal electrode pattern on the ceramic green sheet, obtaining a laminated body by laminating a plurality of the ceramic green sheets on which the internal electrode patterns are formed, obtaining ceramic sintered bodies by cutting the laminated body into individual elements and firing the individual elements, and forming external electrodes on the outer surfaces of the ceramic sintered bodies, wherein the carrier film has a surface on which the ceramic slurry is coated in which the maximum height $R_{max}$ as defined in JIS B0601 is about 0.2 $\mu$m or less.

According to another preferred embodiment of the present invention, a method for manufacturing a laminated ceramic electronic component includes the steps of pulling out a carrier film from a carrier film roll, coating one surface of the carrier film with a ceramic slurry at a coating rate of about 30 m/min or higher, forming a ceramic green sheet by drying the coated ceramic slurry, forming an internal electrode pattern on the ceramic green sheet, obtaining a laminated body by laminating a plurality of the ceramic green sheets on which the internal electrode patterns are formed, obtaining ceramic sintered bodies by cutting the laminated body into individual elements and firing the individual elements, and forming external electrodes on the outer surfaces of the ceramic sintered bodies, wherein the carrier film has a surface on which the ceramic slurry is coated in which the maximum height $R_{max}$ as defined in JIS B0601 is about 0.2 $\mu$m or less, a mold release layer is formed in the ceramic slurry coated surface, and the maximum height $R_{max}$ as defined in JIS B0601 of the surface of the carrier film that is opposite to the surface upon which the ceramic slurry is coated is about 0.5 $\mu$m to about 1 $\mu$m.

According to yet another preferred embodiment of the present invention, a method for manufacturing a laminated ceramic electronic component includes the steps of pulling out a carrier film from a carrier film roll, coating one surface of the carrier film with a ceramic slurry at a coating rate of about 30 m/min or higher, forming a ceramic green sheet by drying the coated ceramic slurry, forming an internal electrode pattern on the ceramic green sheet, obtaining a laminated body by laminating a plurality of the ceramic green sheets on which the internal electrode patterns are formed, obtaining ceramic sintered bodies by cutting the laminated body into individual elements and firing the individual elements, and forming external electrodes on the outer surfaces of the ceramic sintered bodies, wherein the carrier film has a surface on which the ceramic slurry is coated in which a maximum height $R_{max}$ as defined in JIS B0601 is about 0.2 $\mu$m or less, a mold release layer is formed in the ceramic slurry coated surface, and a maximum height $R_{max}$ as defined in JIS B0601 of the surface of the carrier film that is opposite to the surface upon which the ceramic slurry is coated is about 0.2 $\mu$m to about 1 $\mu$m, and an anti-static layer is formed on at least one surface of the carrier film.

In these methods for manufacturing a laminated ceramic electronic component, it is desirable that the thickness of the ceramic layers defining the ceramic sintered body be about 3 $\mu$m or less.

By using the carrier film that has a surface on which the ceramic slurry is coated in which the maximum height $R_{max}$ as defined in JIS B0601 is about 0.2 $\mu$m or less, recesses and pinholes are prevented from occurring in the ceramic green sheet when the ceramic slurry is applied and dried.

Furthermore, when coating one surface of the carrier film with a ceramic slurry at a coating rate of about 30 m/min or higher, if the maximum height $R_{max}$ of the surface of the carrier film that is opposite to surface coated with ceramic slurry is about 1 $\mu$m or less, defects in the ceramic green sheet can be prevented during the take-up of the carrier film, and the introduction of air can also be prevented. Moreover, when the maximum height $R_{max}$ of the surface of the carrier film that is opposite to the ceramic slurry coated surface is about 0.5 $\mu$m or more, the electrostatic charge caused by peeling can be minimized.

In addition, in cases where an anti-static layer is formed on the carrier film, it is possible to further reduce the electrostatic charge caused by peeling if the maximum height $R_{max}$ of the surface of the carrier film that is opposite to the ceramic slurry coated surface is about 0.2 $\mu$m or more.

These unique advantages and effects are conspicuously apparent when the thickness of the ceramic layers defining the ceramic sintered body of a laminated ceramic electronic component is reduced to about 3 $\mu$m or less.

Other features, elements, steps, characteristics and advantages of the present invention will become more apparent from the following detailed description of preferred embodiments thereof with reference to the attached drawings.

DETAILED DESCRIPTION OF PREFERRED EMBODIMENTS

Preferred embodiments of the present invention will be described below with reference to the drawings.

Here, a method for manufacturing a laminated ceramic capacitor is described as an example of a laminated ceramic electronic component. Although the laminated ceramic capacitor manufacturing method is not limited to this electronic component alone, a method is used which includes the steps described with reference to FIG. 1 and in which special features are particularly added to the carrier film 14. In this manufacturing process, the coating rate of the ceramic slurry 18, i.e., the rate at which the carrier film 14 is pulled out from the carrier film roll 12, is preferably about 30 m/min or higher. Setting the coating rate at such a value makes it possible to reduce variations in the thickness of the ceramic green sheet 22 even in cases where the thickness of ceramic layers is reduced. In the manufacturing apparatus 10 shown in FIG. 1, a carrier film 14 made primarily of polyester, for example, is preferably used. Here, polyester refers to polyester in which at least approximately 70% of the repeated structural unit is an ethylene terephthalate unit, an ethylene-2,6-naphthalate unit, or a 1,4-cyclohexane naphthalate unit.

A film that defines the carrier film 14 has a surface in which the maximum height $R_{max}$ of the surface that is coated with the ceramic slurry 18 as defined in JIS B0601 is about 0.2 μm or less. The use of the carrier film 14 that has such a surface greatly reduces and minimizes the possibility of recesses and pinholes being produced in the ceramic green sheet 22, so that a laminated ceramic capacitor can be obtained which has much fewer problems such as short-circuiting of the internal electrodes and a decrease in reliability, as compared to conventional devices. In particular, in cases where the thickness of the ceramic layers forming the ceramic sintered body is reduced to about 3 μm or less, such unique advantages and effects are reliably obtained. A mold release layer may be preferably formed in the ceramic slurry coated surface of the carrier film 14. The formation of a mold release layer can facilitate the peeling of the ceramic green sheet 22 from the carrier film 14.

Furthermore, a film having a surface in which the maximum height $R_{max}$ as defined in JIS B0601 of the surface that is opposite to the ceramic slurry coated surface is about 0.5 μm to about 1 μm is preferably used as the carrier film 14. The use of such a carrier film 14 prevents the occurrence of defects in the surface of the ceramic green sheet 22 when the carrier film 14 on which the ceramic green sheet 22 is formed is rolled up. Likewise, by using such a carrier film 14, the introduction of air is prevented during take-up of the film, and the generation of creases in the ceramic green sheet 22 can be reliably prevented. Moreover, the use of the carrier film 14 greatly reduces the electrostatic charge caused by peeling. In addition, in cases where an anti-static layer is formed on the surface of the carrier film 14 that is opposite to the surface on which the ceramic green sheet is formed, the electrostatic charge caused by peeling can be even more reduced with a film that has the opposite surface in which the $R_{max}$ is about 0.2 μm to about 1 μm.

Furthermore, by using such a carrier film 14, the degree of adhesion between the overlapping carrier films 14 in the carrier film roll 12 does not become excessively large, so that an electrostatic charge is less likely to occur when the carrier film 14 is pulled out. Moreover, in cases where an anti-static layer is formed on the carrier film, the possibility of an electrostatic charge is further reduced and minimized. As a result, it is possible to greatly reduce the electrostatic charge caused by unrolling of the carrier film 14 even in cases where high-speed coating is performed with the ceramic slurry 18 at a coating rate of about 30 m/min or higher.

Thus, the use of such a carrier film 14 makes it possible to coat the surface of the carrier film 14 with the ceramic slurry 18 at a high speed and to obtain a thin ceramic green sheet 22 in which variations in thickness are prevented and minimized. In addition, the effect of static electricity can be greatly reduced, so that it is possible to prevent the generation of creases or other defects in the ceramic green sheet 22. As a result of these unique advantages and effects, highly reliable laminated ceramic capacitors can be produced without short-circuiting of internal electrodes and other defects and problems.

In the following paragraphs, examples of preferred embodiments of the present invention will be described.

EXAMPLE 1

A PET (polyethylene terephthalate) film was prepared as the carrier film. In this example, particles were included in the PET film in order to evaluate the unevenness on the surface of the carrier film by varying $R_{max}$. Inorganic particles, organic particles, and deposited particles produced during polymerization of polyester, etc., can be used as the above-mentioned particles.

In the present example, furthermore, sandblasting was performed in order to adjust the maximum heights $R_{max}$ of the ceramic slurry coated surface and the opposite surface of the PET film as defined in JIS B0601. Incidentally, a method for adjusting $R_{max}$ is not limited to a method using sandblasting. It is also possible to use a method in which PET films having different surface roughness are joined together, or a method in which one surface of the PET film is coated with resin to vary the surface roughness.

The surface to be coated with a ceramic slurry of the PET film thus obtained was coated with a ceramic slurry primarily composed of a barium titanate ceramic powder so that the average thickness of the ceramic layers forming the ceramic sintered body was about 2.5 μm, and this surface was dried to form a ceramic green sheet. Next, Ni paste was printed on this ceramic green sheet and dried, and the PET film was rolled up. The rolled PET film was pulled out, and while peeling off the ceramic green sheet having the Ni paste printed thereon from the PET film, 100 of these ceramic green sheets were laminated to obtain a laminated body. This laminated body was cut into individual chip elements and fired, so that ceramic sintered bodies were obtained. Then, laminated ceramic capacitors were provided by forming external electrodes.

The electrostatic charge caused by peeling that was generated by peeling off the ceramic green sheet from the PET film was measured in an atmosphere at a temperature of about 25° C. and humidity of approximately 50% RH. This measurement of electrostatic charge caused by peeling was performed using KSD0103 of Kasuga Denki, Inc. Furthermore, the short-circuit failure of the internal electrodes of the obtained laminated ceramic capacitor was evaluated. This evaluation of the short-circuit failure was conducted using HP-4278A of Yokogawa Hewlett-Packard under the conditions in which the temperature was about 25° C., the humidity was approximately 50% RH, the frequency was about 1 kHz, and the voltage was about 0.5 V. Three hundred samples were used in this evaluation. In addition, the ceramic green sheet was evaluated in terms of the number of defects by observing approximately 15 cm² of area on each surface of the ceramic green sheet using a 200× optical microscope. These evaluation results are shown in FIG. 2 and FIG. 3.

Figure 2:
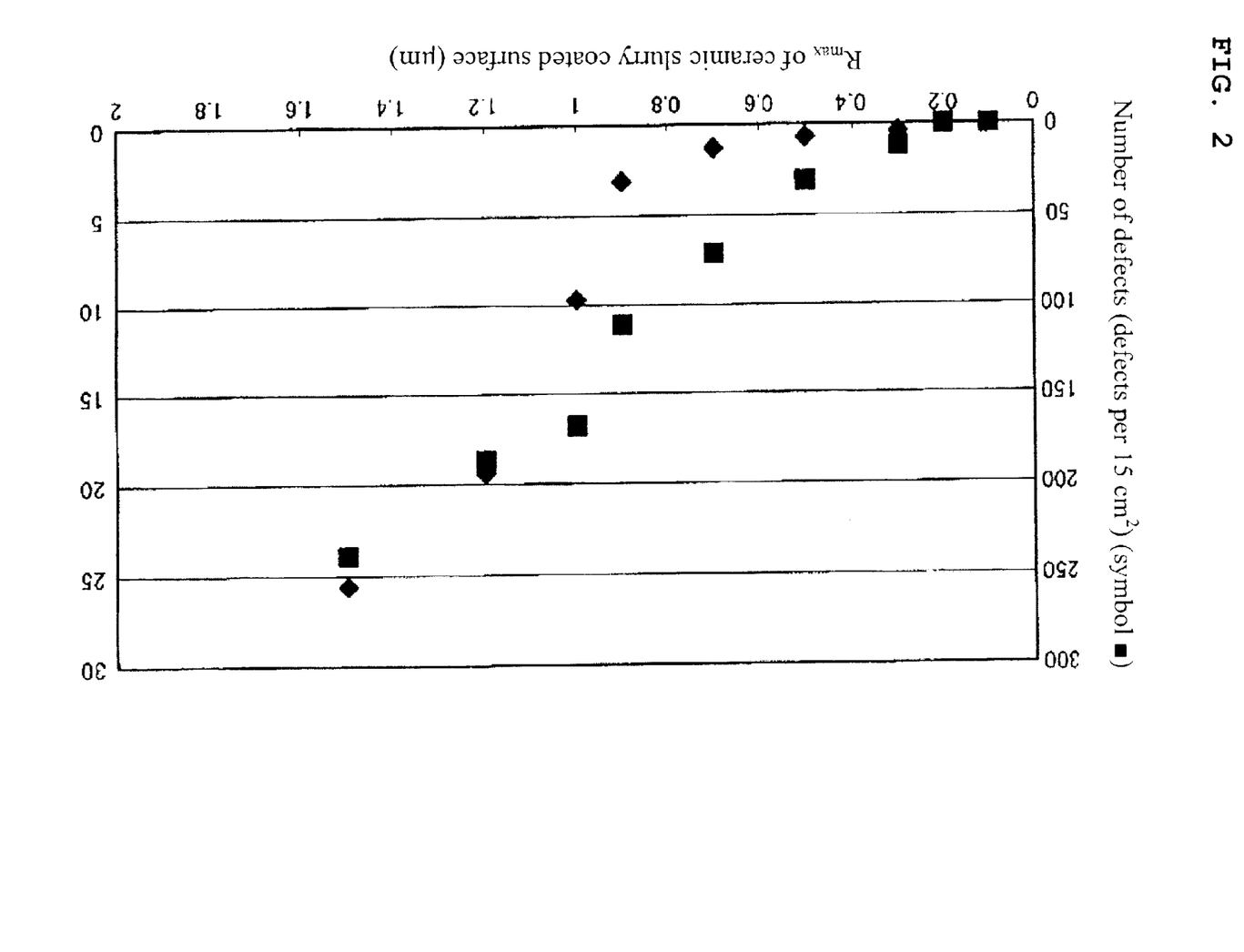
FIG. 2 is a graph showing the relationship between the short-circuit failure rate of the laminated ceramic capacitor, the number of defects in the surface of the ceramic green sheet on the side of the PET film, and $R_{max}$ of the ceramic slurry coated surface of the PET film in Example 1.

FIG. 2 shows the short-circuit failure rate for laminated ceramic capacitors and the number of defects in the ceramic green sheet on the side of the PET film when $R_{max}$ of the surface of the PET film that is opposite to the surface with the ceramic slurry coated thereon is about 1 μm, and $R_{max}$ of the ceramic slurry coated surface is varied. It is seen from FIG. 2 that zero defects and 0% short-circuit failure rate was achieved when $R_{max}$ of the ceramic slurry coated surface of the PET film was about 0.2 μm or less.

Figure 3:
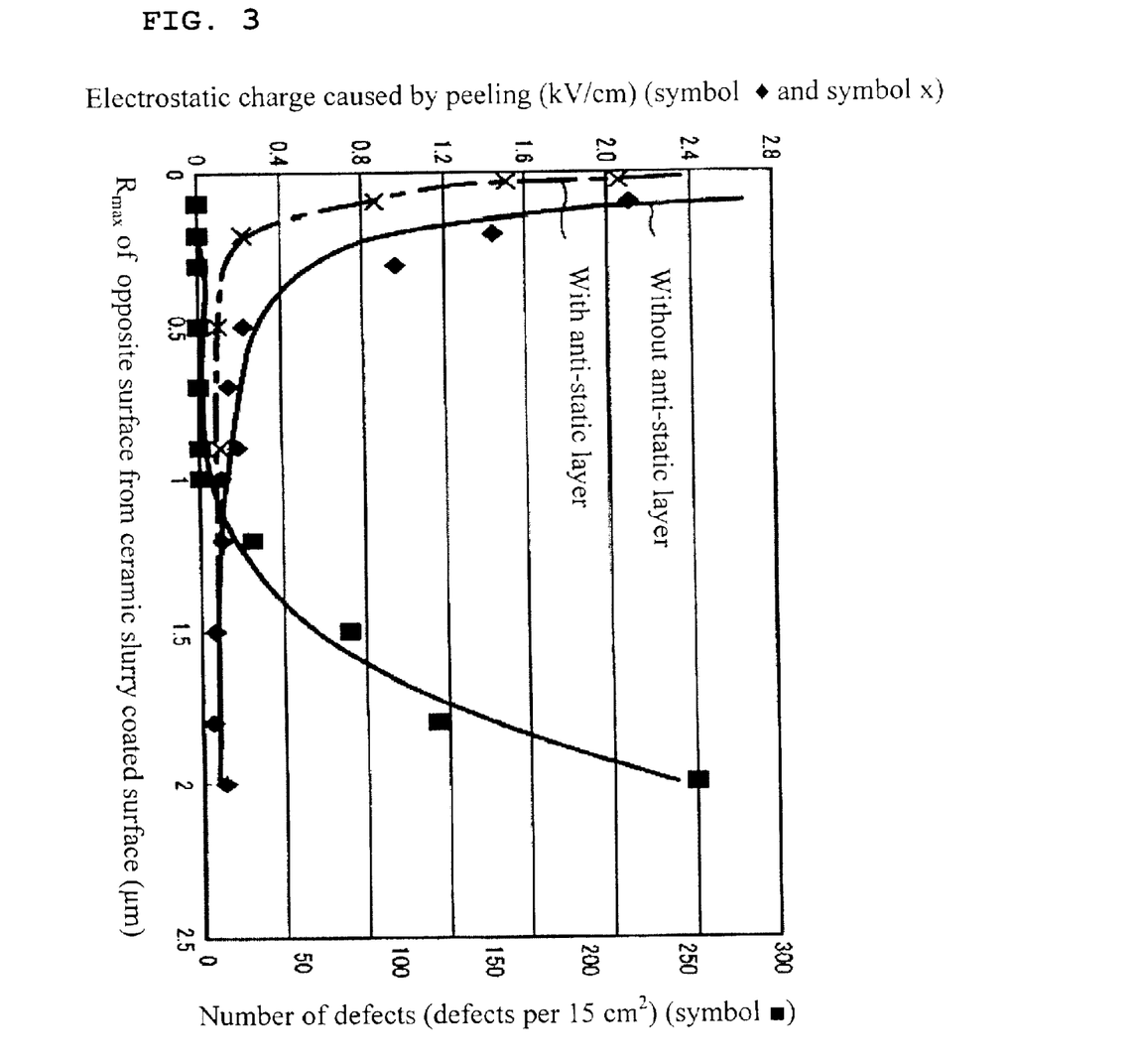
FIG. 3 is a graph showing the relationship between $R_{max}$ of the surface of the PET film that is opposite to the ceramic slurry coated surface, the electrostatic charge caused by peeling, and the number of defects in the surface of the ceramic green sheet on the side opposite to the PET film side in Example 1.

Furthermore, FIG. 3 shows the electrostatic charge caused by peeling and the number of defects on the surface of the ceramic green sheet on the side opposite to the PET film side when $R_{max}$ of the ceramic slurry coated surface of the PET film is about 0.2 μm, and $R_{max}$ of the surface of the PET film that is opposite to the ceramic slurry coated surface was varied. It is apparent from FIG. 3 that the number of defects in the sheet is zero when $R_{max}$ of the surface of the PET film that is opposite to the ceramic slurry coated surface is about 1 µm or less. The reason for this is that the effect of the unevenness on the opposite surface of the PET film on the surface of the ceramic green sheet is small even if the opposite surface of the PET film tightly adheres to the surface of the ceramic green sheet when the PET film is rolled up. Moreover, when $R_{max}$ of the surface of the PET film that is opposite to the ceramic slurry coated surface was about 0.5 µm or more, the electrostatic charge caused by peeling was about 0.2 kV/cm or less. In addition, in cases where an anti-static layer was formed on the surface of the PET film that is opposite to the ceramic slurry coated surface, the electrostatic charge caused by peeling was about 0.2 kV/cm or less when $R_{max}$ of the surface that is opposite to the ceramic slurry coated surface was about 0.2 µm or more.

As is understood from these results, the occurrence of the short-circuit failure of a laminated ceramic capacitor is effectively and reliably prevented when $R_{max}$ of the ceramic slurry coated surface of the PET film is about 0.2 µm or less, and $R_{max}$ of the surface of the PET film that is opposite to the ceramic slurry coated surface is about 0.5 µm to about 1.0 µm. Furthermore, in cases where an anti-static layer is formed on the surface of the PET film that is opposite to the ceramic slurry coated surface, the occurrence of the short-circuit failure of a laminated ceramic capacitor is prevented when $R_{max}$ of the ceramic slurry coated surface of the PET film is about 0.2 µm or less, and $R_{max}$ of the surface opposite to the ceramic slurry coated surface is about 0.2 µm to about 1.0 µm.

EXAMPLE 2

In this example, the short-circuit failure of the laminated ceramic capacitor was evaluated by varying the thickness of the ceramic layers defining the ceramic sintered body. Here, the PET films shown in Table 1 were used as the PET films to be coated with a ceramic slurry.

TABLE 1

| Sample No. | PET film | $R_{max}$ of the ceramic slurry coated surface | $R_{max}$ of the surface opposite to the ceramic slurry coated surface |
|---|---|---|---|
| 1 | Present Invention | 0.2 µm | 1.0 µm |
| 2 | Comparative Example 1 | 0.4 µm | 1.0 µm |
| 3 | Comparative Example 2 | 1.0 µm | 0.2 µm |

The surfaces to be coated with a ceramic slurry of the PET films shown in Table 1 were coated with a ceramic slurry having a principle component of a barium titanate ceramic powder, and these surfaces were dried to form ceramic green sheets. Ni paste was printed on the ceramic green sheets and dried. While peeling off the ceramic green sheets having the Ni paste printed thereon from the PET films, 100 of the ceramic green sheets were laminated to obtain a laminated body. The laminated body was cut into individual chip elements and fired, thus forming ceramic sintered bodies. Then, laminated ceramic capacitors were produced by forming external electrodes on the ceramic sintered bodies. The short-circuit failure of the obtained laminated ceramic capacitors was measured, and the short-circuit failure rate is shown in FIG. 4.

Figure 4:
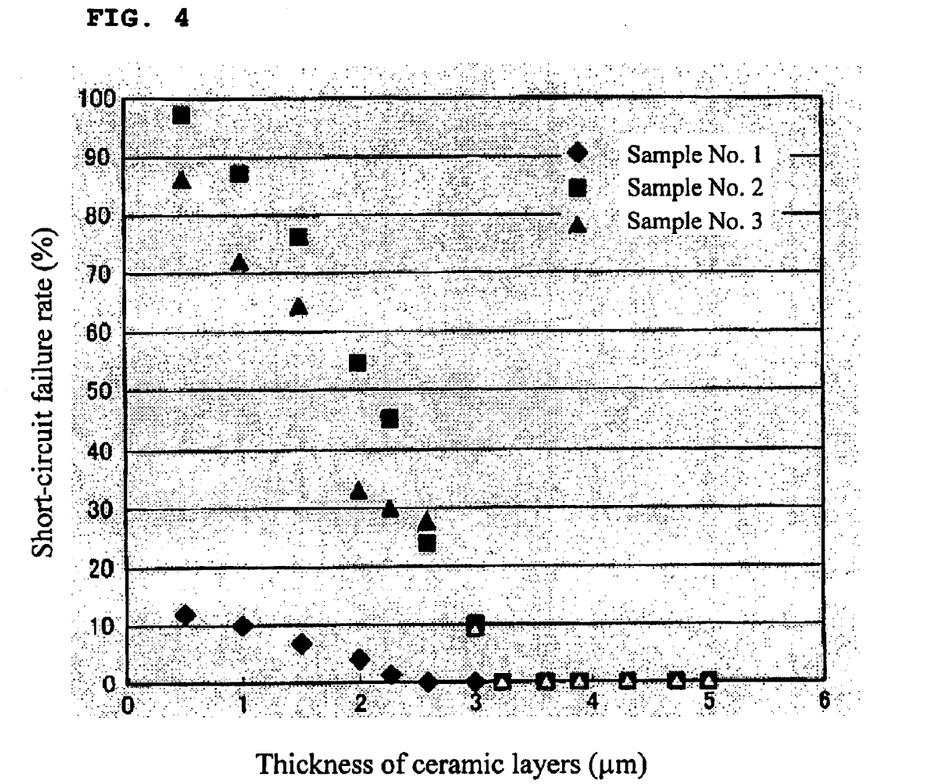
FIG. 4 is a graph showing the relationship between the short-circuit failure rate and the thickness of the ceramic layers in the laminated ceramic capacitor in Example 2.

It is seen from FIG. 4 that in cases where the PET film of preferred embodiments of the present invention was used, the short-circuit failure rate of the laminated ceramic capacitor was about 12% or less even when the thickness of the ceramic layers forming the ceramic sintered body of the laminated ceramic capacitor was about 3 µm or less. In contrast, in cases where the PET film of Comparative Example 1 or Comparative Example 2 was used, when the thickness of the ceramic layers defining the ceramic sintered body was about 3 µm or less, the short-circuit failure rate of the laminated ceramic capacitor greatly increased.

As is apparent from this result, the occurrence of short-circuit failure of the laminated ceramic capacitor can be prevented and minimized by using, as the carrier film, a PET film in which $R_{max}$ of the ceramic slurry coated surface is about 0.2 µm, and in which $R_{max}$ of the surface opposite to the ceramic slurry coated surface is about 1.0 µm even if the thickness of the ceramic layers defining the ceramic sintered body is about 3 µm or less. Moreover, a PET film was used as the carrier film in this example. However, similar effects can be expected not only by using such a synthetic resin film, but also by using a metal plate or foil if projections of both surfaces thereof have the above-mentioned values.

EXAMPLE 3

In this example, the relationship between the coating rate of the ceramic slurry, i.e., the rate at which the PET film is rolled up, and the introduction of air in the rolled PET film was evaluated. Here, the surface of the PET film was coated with the ceramic slurry so that the thickness of the ceramic layers forming the ceramic sintered body was about 3 µm when the laminated ceramic capacitor was formed. The PET films used in this example are shown in Table 2.

TABLE 2

| Sample No. | PET film | $R_{max}$ of the ceramic slurry coated surface | $R_{max}$ of the surface opposite to the ceramic slurry coated surface | Anti-static layer |
|---|---|---|---|---|
| 4 | Present Invention | 0.2 µm | 1.0 µm | Absent |
| 5 | Present Invention | 0.2 µm | 1.0 µm | Present |
| 6 | Present Invention | 0.2 µm | 0.5 µm | Absent |
| 7 | Comparative Ex. 3 | 0.2 µm | 0.2 µm | Absent |
| 8 | Comparative Ex. 4 | 0.2 µm | 0.4 µm | Absent |
| 9 | Comparative Ex. 5 | 1.0 µm | 1.0 µm | Absent |

The carrier films shown in Table 2 were coated with the ceramic slurry by varying the ceramic slurry coating rate, and were dried to form ceramic green sheets. Ni paste was coated on the surfaces of the ceramic green sheets, dried, and rolled up, and the presence or absence of the introduced air was examined. For this measurement, ceramic green sheets were formed for 30 minutes after the formation rate of the ceramic green sheets was stabilized, and rolling misalignment caused by the introduction of air was investigated. Table 3 shows the result of this investigation.

TABLE 3

| Sample No. | Ceramic slurry coating rate (m/min) | | | | | | | | |
|---|---|---|---|---|---|---|---|---|---|
| | 10 | 20 | 30 | 40 | 50 | 75 | 100 | 120 | 150 |
| 4 | Absent | Absent | Absent | Absent | Absent | Absent | Absent | Absent | Absent |
| 5 | Absent | Absent | Absent | Absent | Absent | Absent | Absent | Absent | Absent |
| 6 | Absent | Absent | Absent | Absent | Absent | Absent | Absent | Absent | Absent |
| 7 | Absent | Present | Present | Present | Investigation impossible because of electrostatic charge caused by unrolling | | | | |
| 8 | Absent | Absent | Present | Present | Present | Present | Present | Present | Present |
| 9 | Absent | Absent | Absent | Absent | Absent | Absent | Absent | Absent | Absent |

It is seen from Table 3 that rolling misalignment caused by the introduction of air during the take-up can be prevented when $R_{max}$ of the ceramic slurry coated surface of the carrier film is about 0.2 μm, and $R_{max}$ of the surface that is opposite to the ceramic slurry coated surface is about 0.5 μm or more. In contrast, in cases where the carrier film of Comparative Example 3 was used, since $R_{max}$ of the surface opposite to the ceramic slurry coated surface was too low (about 0.2 μm), the introduction of air was recognized at a coating rate of the ceramic slurry of about 20 m/min or higher, and once this rate reached about 50 m/min or higher, the electrostatic charge caused by unrolling became so large that the investigation was impossible. Furthermore, in cases where the carrier film of Comparative Example 4 was used, the introduction of air was recognized once the coating rate of the ceramic slurry reached about 30 m/min or higher. When the carrier film of Comparative Example 5 was used, although the introduction of air was not seen, $R_{max}$ of the ceramic slurry coated surface was high (1.0 μm), so that defects were produced in the ceramic green sheet.

EXAMPLE 4

In this example, the relationship between the coating rate of the ceramic slurry, i.e., the rate at which the PET film is pulled out from the carrier film roll, and the electrostatic charge caused by unrolling was evaluated. The PET films used here are shown in Table 4.

TABLE 4

| Sample No. | PET film | $R_{max}$ of the ceramic slurry coated surface | $R_{max}$ of the surface opposite to the ceramic slurry coated surface | Anti-static layer |
|---|---|---|---|---|
| 10 | Present Invention | 0.2 μm | 0.5 μm | Absent |
| 11 | Present Invention | 0.2 μm | 1.0 μm | Absent |
| 12 | Present Invention | 0.2 μm | 1.0 μm | Present |
| 13 | Comparative Ex. 6 | 1.0 μm | 1.0 μm | Absent |
| 14 | Comparative Ex. 7 | 0.2 μm | 0.2 μm | Absent |

Figure 5:
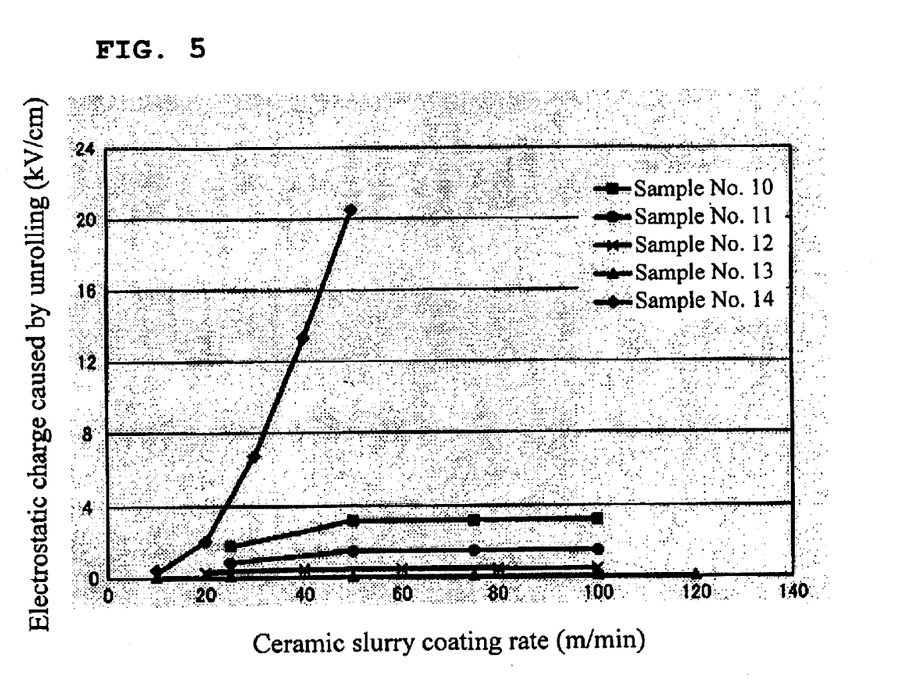
FIG. 5 is a graph showing the relationship between the coating rate of the ceramic slurry and the electrostatic charge caused by unrolling in Example 4.

FIG. 5 shows the relationship between the coating rate of the ceramic slurry and the electrostatic charge caused by unrolling when these PET films were used. It is seen from FIG. 5 that the electrostatic charge caused by unrolling is about 4 kV/cm or less in cases where the PET films of preferred embodiments of the present invention are used even when the coating rate of the ceramic slurry is about 30 m/min or higher. An aromatic solvent is contained in the ceramic slurry, and the electrostatic charge caused by unrolling of the PET films pulled out from the carrier film roll needs to be controlled to about 4 kV/cm or less. However, when the carrier films of preferred embodiments of the present invention are used, even if the PET film is pulled out at a rate of about 30 m/min or higher, the controlling range of the electrostatic charge caused by unrolling can be satisfied. In contrast, when the PET film of Comparative Example 7 is used, $R_{max}$ of the surface opposite to the ceramic slurry coated surface is low (about 0.2 μm), so that the electrostatic charge caused by unrolling inevitably increases if this PET film is pulled out at a rate of about 30 m/min or higher. When the PET film of Comparative Example 6 is used, the electrostatic charge caused by unrolling is small, but because $R_{max}$ of the ceramic slurry coated surface is high (about 1.0 μm), defects are produced in the ceramic green sheet.

According to preferred embodiments of the present invention, a ceramic green sheet with a uniform thickness can be formed by setting the coating rate of a ceramic slurry on the surface of the carrier film at about 30 m/min or higher. Furthermore, significant reduction in thickness is possible to the extent that the thickness of the ceramic layers following the sintering of the laminated body is about 3 μm or less. In this case, by regulating $R_{max}$ of both surfaces of the carrier film including a surface to be coated with a ceramic slurry and a surface that is opposite to the surface coated with ceramic slurry, the electrostatic charge caused by unrolling and the electrostatic charge caused by peeling are greatly reduced and minimized, so that the generation of defects is prevented during the formation of a ceramic green sheet. Accordingly, it is possible to increase reliability of the final products such as laminated ceramic electronic components.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A method for manufacturing a laminated ceramic electronic component comprising steps of:
   pulling out a carrier film from a carrier film roll;
   coating a surface of said carrier film with a ceramic slurry at a coating rate of about 30 m/min or higher;
   forming a ceramic green sheet by drying said coated ceramic slurry;
   forming an internal electrode pattern on said ceramic green sheet;
   obtaining a laminated body by laminating a plurality of said ceramic green sheets on which said internal electrode patterns are formed;

obtaining ceramic sintered bodies by cutting said laminated body into individual elements and firing the individual elements; and forming external electrodes on outer surfaces of said ceramic sintered bodies;

wherein said surface of said carrier film on which said ceramic slurry is coated has a surface in which a maximum height $R_{max}$ as defined in Japanese Industrial Standard B0601 is about 0.2 μm or less; and wherein a surface of said carrier film that is opposite to said surface of said carrier film on which said ceramic slurry is coated has a surface in which a maximum height $R_{max}$ as defined in Japanese Industrial Standard B0601 is about 0.5 μm to about 1 μm.

2. The method of manufacturing a laminated ceramic electronic component according to claim 1, wherein the thickness of the ceramic layers defining said ceramic sintered body is about 3 μm or less.

3. The method for manufacturing a laminated ceramic electronic component according to claim 1, wherein the laminated electronic component is one of a laminated ceramic capacitor, a laminated inductor, and a laminated LC filter.

4. The method for manufacturing a laminated ceramic electronic component according to claim 1, wherein the carrier film is made primarily of polyester.

5. A method for manufacturing a laminated ceramic electronic component comprising steps of:

pulling out a carrier film from a carrier film roll;

coating a surface of said carrier film with a ceramic slurry at a coating rate of about 30 m/min or higher;

forming a ceramic green sheet by drying said coated ceramic slurry;

forming an internal electrode pattern on said ceramic green sheet;

obtaining a laminated body by laminating a plurality of said ceramic green sheets on which said internal electrode patterns are formed;

obtaining ceramic sintered bodies by cutting said laminated body into individual elements and firing the individual elements; and forming external electrodes on the outside surfaces of said ceramic sintered bodies;

wherein said surface of said carrier film on which said ceramic slurry is coated has a surface in which a maximum height $R_{max}$ as defined in Japanese Industrial Standard B0601 is about 0.2 μm or less, a mold release layer is formed in said surface of said carrier film on which said ceramic slurry is coated, and the maximum height $R_{max}$ as defined in Japanese Industrial Standard B0601 of the surface of said carrier film that is opposite to said surface of said carrier film on which said ceramic slurry is coated is about 0.5 μm to about 1 μm.

6. The method of manufacturing a laminated ceramic electronic component according to claim 5, wherein the thickness of the ceramic layers defining said ceramic sintered body is about 3 μm or less.

7. The method for manufacturing a laminated ceramic electronic component according to claim 5, wherein the laminated electronic component is one of a laminated ceramic capacitor, a laminated inductor, and a laminated LC filter.

8. The method for manufacturing a laminated ceramic electronic component according to claim 5, wherein the carrier film is made primarily of polyester.

9. A method for manufacturing a laminated ceramic electronic component comprising steps of:

pulling out a carrier film from a carrier film roll;

coating a surface of said carrier film with a ceramic slurry at a coating rate of about 30 m/min or higher;

forming a ceramic green sheet by drying said coated ceramic slurry;

forming an internal electrode pattern on said ceramic green sheet;

obtaining a laminated body by laminating a plurality of said ceramic green sheets on which said internal electrode patterns are formed;

obtaining ceramic sintered bodies by cutting said laminated body into individual elements and firing the individual elements; and forming external electrodes on the outside surfaces of said ceramic sintered bodies;

wherein said surface of said carrier film on which said ceramic slurry is coated has a surface in which a maximum height $R_{max}$ as defined in Japanese Industrial Standard B0601 is about 0.2 μm or less, a mold release layer is formed in said surface of said carrier film on which said ceramic slurry is coated, and the maximum height $R_{max}$ as defined in Japanese Industrial Standard B0601 of the surface of said carrier film that is opposite to said surface of said carrier film on which said ceramic slurry is coated is about 0.2 μm to about 1 μm, and an anti-static layer is formed on at least one surface of said carrier film.

10. The method of manufacturing a laminated ceramic electronic component according to claim 9, wherein the thickness of the ceramic layers defining said ceramic sintered body is about 3 μm or less.

11. The method for manufacturing a laminated ceramic electronic component according to claim 9, wherein the laminated electronic component is one of a laminated ceramic capacitor, a laminated inductor, and a laminated LC filter.

12. The method for manufacturing a laminated ceramic electronic component according to claim 9, wherein the carrier film is made primarily of polyester.

* * * * *